United States Patent

DePoy et al.

Patent Number: 6,043,426
Date of Patent: Mar. 28, 2000

[54] THERMOPHOTOVOLTAIC ENERGY CONVERSION SYSTEM HAVING A HEAVILY DOPED N-TYPE REGION

[75] Inventors: David M. DePoy; Greg W. Charache; Paul F. Baldasaro, all of Clifton Park, N.Y.

[73] Assignee: The United States of America as represented by the United States Department of Energy, Washington, D.C.

[21] Appl. No.: 09/253,138

[22] Filed: Feb. 19, 1999

Related U.S. Application Data

[60] Provisional application No. 60/075,416, Feb. 20, 1998.

[51] Int. Cl.$^7$ .................................................. H01L 31/058
[52] U.S. Cl. ............................................ 136/253; 136/206
[58] Field of Search ................................. 136/206, 253, 136/254, 257, 264

[56] References Cited

U.S. PATENT DOCUMENTS

| | | | |
|---|---|---|---|
| 3,088,989 | 5/1963 | Lipkis | 136/4 |
| 3,539,883 | 11/1970 | Harrison | 317/234 |
| 4,967,112 | 10/1990 | Day | 310/304 |
| 5,009,719 | 4/1991 | Yoshida | 136/249 |
| 5,223,043 | 6/1993 | Olson et al. | 136/249 |
| 5,403,405 | 4/1995 | Fraas et al. | 136/253 |
| 5,407,491 | 4/1995 | Freundlich et al. | 136/249 |
| 5,626,687 | 5/1997 | Campbell | 136/259 |
| 5,753,050 | 5/1998 | Charache et al. | 136/255 |
| 5,769,964 | 6/1998 | Charache et al. | 136/262 |
| 5,853,497 | 12/1998 | Lillington et al. | 136/249 |

OTHER PUBLICATIONS

Merriam Webster's Collegiate Dictionary, 10th edition, Merriam–Webster, Incorporated Springfield, Mass, p. 849, 1997.

"Electrical and Optical Properties of Degenerately–Doped N–type $In_xGa_{1-x}As$", G.W. Charache et al., Third NREL Conference on the Thermophotovoltaic Generation of Electricity, Colorado Springs, CO May 18–21, 1997.

*Primary Examiner*—Nam Nguyen
*Assistant Examiner*—Mike Miggins
*Attorney, Agent, or Firm*—Virginia B. Caress; William R. Moser; Paul A. Gottlieb

[57] ABSTRACT

A thermophotovoltaic (TPV) energy conversion semiconductor device is provided which incorporates a heavily doped n-type region and which, as a consequence, has improved TPV conversion efficiency. The thermophotovoltaic energy conversion device includes an emitter layer having first and second opposed sides and a base layer in contact with the first side of the emitter layer. A highly doped n-type cap layer is formed on the second side of the emitter layer or, in another embodiment, a heavily doped n-type emitter layer takes the place of the cap layer.

18 Claims, 2 Drawing Sheets

THERMOPHOTOVOLTAIC ENERGY CONVERSION SYSTEM HAVING A HEAVILY DOPED N-TYPE REGION

This application claims the benefit of U.S. Provisional Application Ser. No. 60/075,416 filed on Feb. 20, 1998.

BACKGROUND OF THE INVENTION

1. Field of the Invention

The present invention generally relates to the field of thermophotovoltaic (TPV) direct energy conversion and more particularly, to an improved TPV semiconductor device that increases conversion efficiency and that incorporates a heavily doped n-type region which provides partial below bandgap spectral control.

2. Related Art

Thermophotovoltaic (TPV) energy systems convert thermal energy to electric power using the same principle of operation as solar cells. In particular, a heat source radiatively emits photons which are incident on the TPV device. The TPV device includes a semiconductor p-n junction, wherein the top layer is referred to as the emitter and the bottom layer is referred to as the base. Photons with energy greater than the semiconductor bandgap, $E_g$ (typically ranging from 0.50 eV to 0.73 eV for TPV devices), excite electrons from the valence band to the conduction band (interband transition). The resultant electron-hole pairs are then collected by metal contacts and can be used to power electrical loads. Photons with an energy less than the semiconductor bandgap are parasitically absorbed as heat. In order to increase the efficiency of a TPV system, some form of spectral control is used to reflect photons, with energy less than the semiconductor bandgap, back to the radiator, where they are recycled.

In U.S. Pat. No. 5,403,405, to Fraas et al., TPV devices are disclosed which include relatively inefficient short pass IR filters for reflecting photons having an energy level below that of the semiconductor bandgap. In one embodiment, disclosed in the Fraas et al. patent, a dielectric filter is provided which has multiple layers which transmit some of the below bandgap radiator energy, which is absorbed as heat in the TPV device and reduces the efficiency of the TPV devices. In another embodiment, a plasma filter is used which has a plasma wavelength $\lambda_p$, ranging between $\lambda_g$ and $2\lambda_g$, where $\lambda_g$ is the characteristic wavelength of the TPV semiconductor layers. Plasma filters having a plasma wavelength $\lambda_p$ between $\lambda_g$ and $2\lambda_g$ exhibit a significant amount of absorption of photons which have an energy level greater than the semiconductor bandgap.

SUMMARY OF THE INVENTION

In accordance with the invention, a TPV semiconductor device is provided which incorporates a heavily doped n-type region and which thereby provides improved TPV conversion efficiency. The use of such a heavily doped n-type region increases TPV system efficiency by increasing the reflection of photons with energy less than the semiconductor bandgap. A heavily doped n-type region layer accomplishes this by functioning as a plasma filter that has high reflection (>95%) for photons with wavelengths greater than ~6 microns. A highly doped n-type region is transparent to photons with energy greater than the semiconductor bandgap and therefore provides the maximum possible output power and efficiency. This is achieved by taking advantage of the Moss Burstein effect which is particularly dramatic in heavily doped n-type material systems with low effective masses.

In accordance with a first preferred embodiment of the invention, a thermophotovoltaic energy conversion device is provided which comprises: an n-type emitter layer having first and second opposed sides; a p-type base layer in contact with the first side of the emitter layer and a highly doped n-type cap layer formed on the second side of the emitter layer. These layers are placed on a p-type substrate.

The TPV device preferably includes an interference filter, positioned between a heat source and the n-type cap layer, for reflecting photons having a wavelength greater than the wavelength corresponding to the bandgap ($\lambda_g$) of the emitter and base layers and less than the plasma wavelength ($\lambda_p$) of the cap layer.

In another preferred implementation of the first embodiment, the TPV device further includes passivation layers located between the n-type emitter layer and the n-type cap layer, and between the p-type base layer and the p-type substrate.

The emitter layer, base layer and the cap layer are preferably formed of semiconductors InGaAs, InGaSb, GaSb, InAs, InGaAsSb, InAsPSb or InPAs. The substrate is preferably formed of semiconductors GaSb, InP, GaAs, InAs, InGaAs, silicon, or InGaAsSb.

The cap layer is doped with Te, Se, Si, Sn or S.

Advantageously, the highly doped cap layer has a plasma wavelength $\lambda_p$ greater than $2\lambda_g$, where $\lambda_g$ is the characteristic wavelength corresponding to the bandgap of the emitter and the base layers.

In another preferred implementation of the first embodiment, the highly doped n-type cap layer has a doping level of $N \geq 5 \times 10^{19} cm^{-3}$.

In accordance with a second preferred embodiment of the invention, a TPV device is provided which comprises: a p-type emitter layer having first and second opposed sides, a n-type base layer in contact with the first side of the emitter layer, and a heavily doped n-type cap layer formed on the second side of the emitter layer. These layers are placed on an n-type substrate.

The TPV device preferably includes an interference filter, positioned between a heat source and the n-type cap layer, for reflecting photons having a wavelength greater than the wavelength corresponding to the bandgap ($\lambda_g$) of the emitter and base layers, and less than the plasma wavelength ($\lambda_p$) of the cap layer.

In another preferred implementation of the second embodiment, the TPV device further includes passivation layers located between the p-type emitter layer and the n-type cap layer and between the n-type base layer and the n-type substrate.

The semiconductor materials and dopants used in the first embodiments can also be used with the second preferred embodiments. The n-type cap layer has the same plasma wavelength ($\lambda_p$) and doping level as described in the first embodiment.

In accordance with a third embodiment of the invention, a thermophotovoltaic energy conversion device is provided which comprises: a p-type base layer; and a highly doped n-type emitter layer attached to the base layer, the emitter layer having a plasma wavelength $\lambda_p$ greater than $2\lambda_g$, where $\lambda_g$ is the characteristic wavelength of the base layer.

The TPV device preferably further includes an interference filter, positioned between a heat source and the n-type emitter layer, for reflecting photons having a wavelength greater than the wavelength corresponding to the bandgap ($\lambda_g$) of the base layer and less than the plasma wavelength ($\lambda_p$) of the emitter layer.

In a preferred implementation of the third embodiment, the TPV device further includes a passivation layer between the p-type base layer and the p-type substrate.

The semiconductor materials and dopants used in the previous embodiments can also be used in this third embodiment.

The highly doped emitter layer preferably has a doping level of $N \geq 5 \times 10^{19}$ cm$^{-3}$.

Other features and advantages of the invention will be set forth in, or apparent from, the following detailed description of the preferred embodiments of the invention.

DESCRIPTION OF THE PREFERRED EMBODIMENTS

Figure 1:
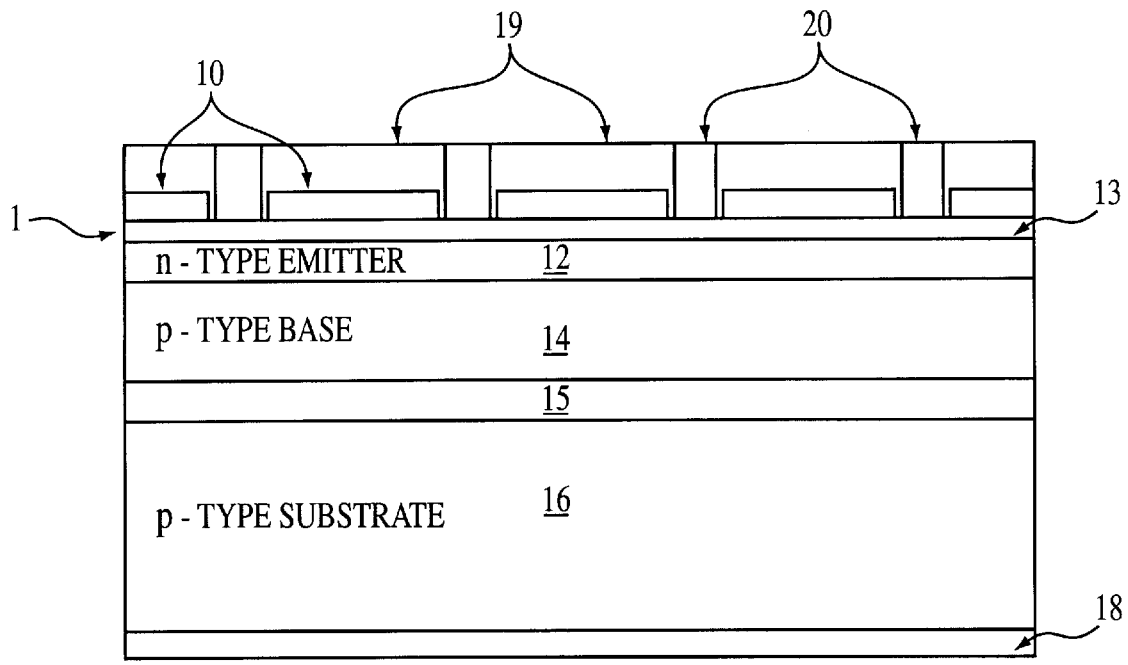
FIG. 1 is a cross sectional view of an n on p TPV device in accordance with a first preferred embodiment of the invention.

Referring to FIG. 1, a cross section is provided of an n on p TPV device 1 with a heavily doped n-type cap layer 10, in accordance with a first preferred embodiment of the invention. An n-type emitter 12 and p-type base 14 are formed on a p-type substrate 16 in a conventional manner. The emitter 12 is relatively thin and heavily doped (N~1–10×10$^{18}$ cm$^{-3}$) and the base 14 is thicker and lightly doped (N~1–10× 10$^{17}$cm$^{-3}$). The emitter 12, base 14 and cap layer 10 are preferably formed of InGaAs or InPAs, although other materials can be used. In alternative preferred implementations, InGaAsSb, InGaSb, InPAsSb, InAs, GaSb are used as the emitter, base and cap layer. The substrate 16 is preferably formed of GaSb, InP, GaAs, InAs, InGaAs, silicon, or InGaAsSb. A back metalization layer 18 is attached to the substrate 16 on the side opposite the base 14. The back metalization 18 preferably consists of Au or AuZn alloy. A front metalization 20 is formed in a grid pattern on top of the emitter 12, as described in more detail below.

The n-type cap layer 10 is preferably formed of heavily doped (N$\geq$5×10$^{19}$cm$^{-3}$) InGaAs or InPAs and has a plasma wavelength $\lambda_p$ greater than $2\lambda_g$, where $\lambda_g$ is the characteristic wavelength of the emitter and base layers. The use of a n-type cap layer having $\lambda_p$ greater than $2\lambda_g$ enables effective transmission of high energy photons. The low effective mass of degenerately doped n-InGaAs or n-InPAs, in particular, makes these materials ideal plasma filters for TPV applications. The n-type cap layer 10 is doped with Te, Se, Si, Sn, or S and provides enhanced reflection of long wavelength photons which thereby increases TPV efficiency as compared to a similar device without a heavily doped n-type cap layer. The heavily doped n-type cap layer 10 functions as a plasma filter with high reflectivity of photons with wavelengths greater than ~6 microns. Cap layer 10 is also transparent to photons with energy greater than the TPV device bandgap due to the Moss Burstein effect, which ensures negligible parasitic absorption of high energy photons which would otherwise reduce TPV device output power and efficiency. The Moss Burstein effect results in the effective bandgap of semiconductor material increasing as the doping concentration increases.

The heavily doped n-type cap layer 10 can be grown as a single crystal epi-layer lattice matched to the TPV device top layer. The top layer of the TPV device can be the emitter layer 12 (as shown in FIG. 1), or, alternatively a passivation layer 13 can also be incorporated between the TPV device emitter layer 12 and the cap layer 10 and a passivation layer 15 between the base layer and the substrate to reduce interface recombination velocity. A lattice matched cap layer would most likely provide the highest charge carrier mobility which would provide the highest plasma reflection characteristics. The cap layer 10 could also be grown lattice mismatched to the TPV device top layer. This would increase the number of possible material systems that would benefit from the plasma reflection characteristics of a heavily doped n-type cap layer. However, this may also reduce charge carrier mobility and plasma reflection performance and may also introduce defects in the TPV device layers beneath the lattice mismatched cap layer.

For an architecture wherein a heavily doped n-type cap layer 10 is provided in an n on p TPV device, the front metalization contacts 20 can be formed directly on the cap layer (this connection is not shown). The front contacts 20 can also be positioned directly on TPV device emitter layer 12 (not shown) or on a passivation layer 13. This can be accomplished by etching through the cap layer 10 and depositing the front contacts. The latter can be achieved using standard photolithography techniques using appropriate wet chemical etching or dry etching techniques such as reactive ion etching.

Figure 2:
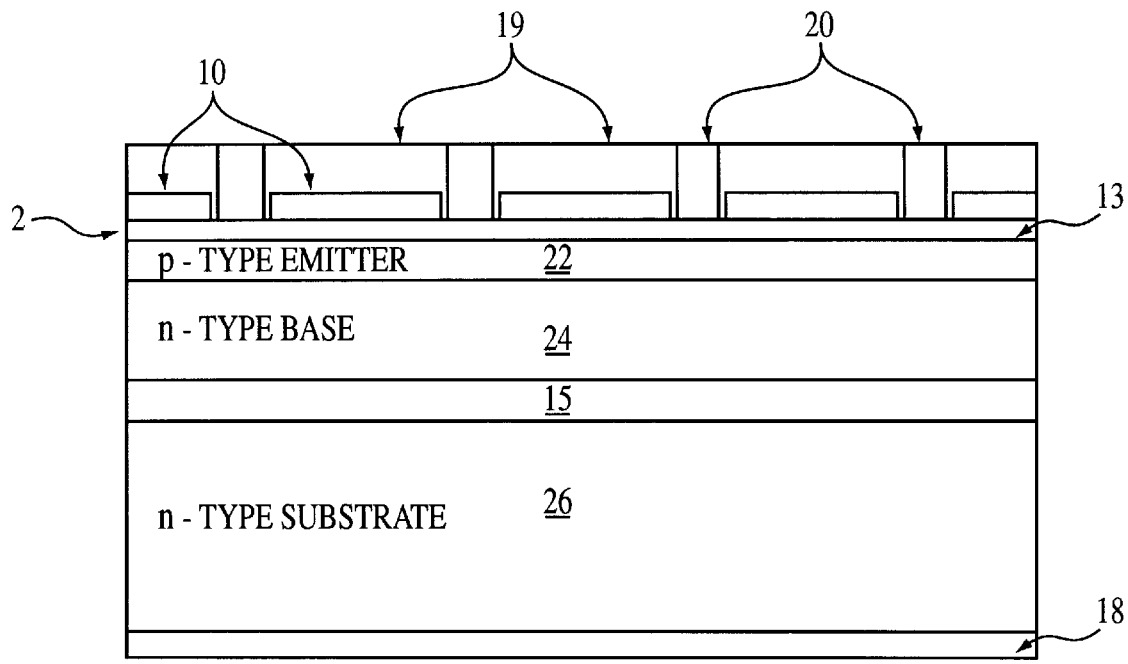
FIG. 2 is a cross sectional view of a p on n TPV device in accordance with a second preferred embodiment of the invention.

In an alternative embodiment illustrated in FIG. 2, a p on n TPV device 2 is provided wherein a heavily doped n-type cap layer 10 is incorporated into the device to provide long wavelength plasma reflection characteristics. Using a p on n device necessitates the use of a wider emitter layer. In one preferred implementation the p-type emitter region, which is denoted 22 in FIG. 2, is 3–5 $\mu$m thick and the n-type base region, denoted 24, is 1–2 $\mu$m thick. The n-type substrate is denoted 26 in FIG. 2. For a p on n TPV device architecture, the front contacts 20 must be made directly to the TPV device p-type emitter layer or to a p-type passivation layer 13. This is required to eliminate the presence of an additional, undesirable, semiconductor p-n junction which would negatively impact TPV device performance.

For both the n on p and the p on n TPV device architectures, the heavily doped n-type cap layer should not have any deleterious effects on the TPV device dark current (TPV device open circuit voltage) or series resistance (TPV device fill factor) that would negate the advantages gained by increasing the below bandgap reflection.

An interference filter 19 can also be used with all the embodiments of the invention to increase the reflection of photons with wavelengths between $\lambda_g$ (the wavelength corresponding to the semiconductor bandgap) and the plasma wavelength $\lambda_p$ of the heavily doped n type cap layer.

Figure 3:
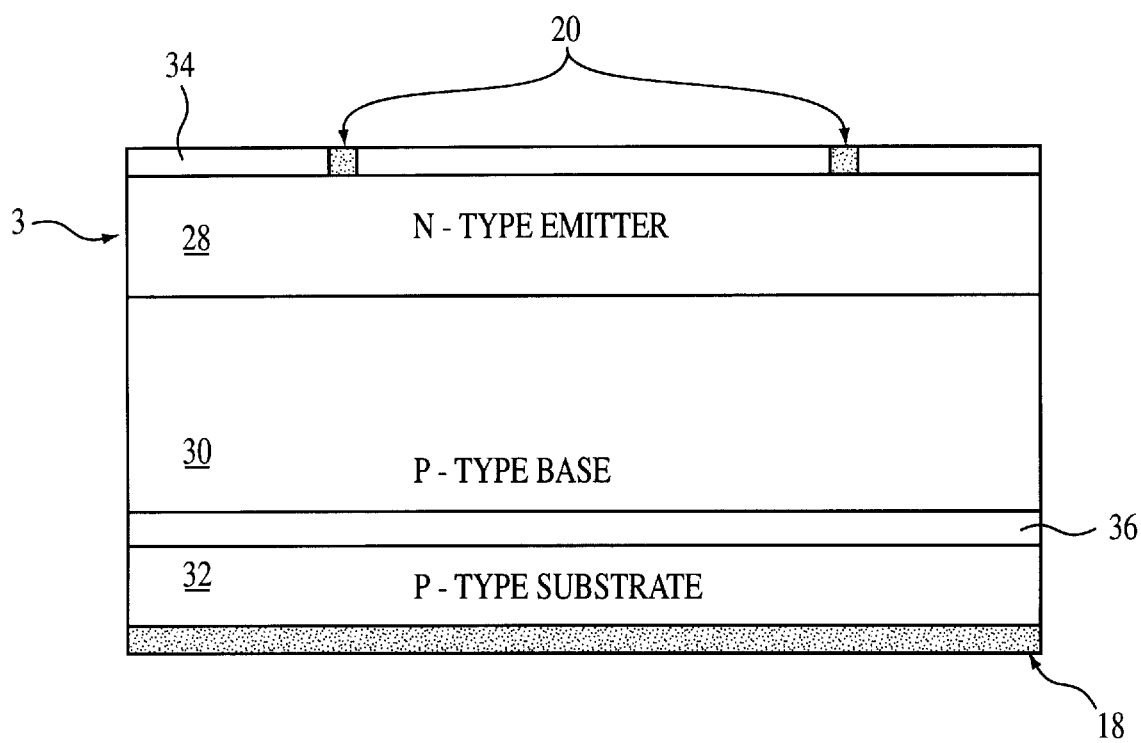
FIG. 3 is a cross sectional view of a highly doped emitter n on p TPV device in accordance with a third preferred embodiment of the invention.

Referring to FIG. 3, there is shown a TPV device, generally denoted 3, constructed in accordance with a third embodiment of the invention. In the embodiment, a highly doped (N$\geq$5×10$^{19}$ cm$^{-3}$) n-type emitter 28 is formed on a p-type base 30 and p-type substrate 32. A back metalization layer 18 and front metalization grid 20 are formed as in the embodiments described above. The heavily doped n-type emitter region 28 acts as an inherent plasma filter and reflects photons having an energy level below that of the semiconductor bandgap. The p-type base is lightly doped (N~1–10 ×10$^{17}$ cm$^{-3}$). The semiconductor materials and dopants used with the previous embodiments can also be used with the embodiment shown in FIG. 3. An interference filter 34 may be added between the heat source and the n-type emitter.

In another preferred implementation of the third embodiment, the TPV device further includes a passivation layer 36 located between the p-type base and the p-type substrate.

The heavily doped n-type emitter region 28 provides a number of intrinsic device advantages over conventional TPV devices. These advantages include the following: increased internal quantum efficiency, elimination of the front surface passivation layer, enhancement of the open circuit voltage, the provision of an inherent bypass diode, and the provision of partial below bandgap spectral control.

These basic devices (FIG. 1–3) can be incorporated into various proposed TPV device architectures that also incorporate front surface spectral control (interference filter) or a back surface reflector (not shown). Specifically, these include the ultra-thin, tunnel junction, emitter-down, and high-voltage devices. (i.e., Monolithic Interconnected Modules) It is noted that the wider effective bandgap of the emitter layer in device 3, due to the Moss Burstein effect, induces advantages similar to device designs of heterojunction emitter solar cells, such as those described by R. Sahai and A. G. Milnes in *Solid State Electronics* 13, 1289 (1970) and S. J. Fonash and A. Rothwarf in *Current Topics in Photovoltaics,* (Academic press, London, 1985). However, as noted before TPV device 3 utilizes the Moss-Burstein shift of the bandgap due to heavy doping of the n-type emitter 28 to obtain a large effective bandgap of the emitter 28. Heterojunction emitter solar cells must use different materials for the base and the emitter. For the invention of the TPV device of FIG. 3, the same material can be used for the emitter 28 and the base 30 thus eliminating the major disadvantage of heterojunction emitter devices, namely those associated with fabricating high-quality electrically-inactive emitter/base heterojunctions.

The primary advantages of the heavily doped emitter is the desirable quantum efficiency versus wavelength and illuminated current versus voltage characteristics. The quantum efficiency increases for wavelengths shorter than 2.0 microns. This is due to a greater number of photons getting absorbed in the base region, which has higher minority carrier diffusion lengths than the emitter.

The device layers discussed above can be formed using conventional semiconductor growth or deposition techniques, such as metalorganic chemical vapor deposition, molecular beam epitaxy, liquid phase epitaxy or chemical vapor deposition.

Although the invention has been described in detail with respect to preferred embodiments thereof, it will be apparent to those skilled in the art that variations and modifications can be effected in these embodiments without departing from the spirit and scope of the invention.

What is claimed is:

1. A thermophotovoltaic energy conversion device comprising:

an n-type emitter layer having first and second opposed sides;

a p-type base layer in contact with the first side of said emitter layer;

a highly doped n-type cap layer formed on the second side of said emitter layer;

and a p-type substrate;

wherein said highly doped n-type cap layer has a doping level N, wherein $N \geq 5 \times 10^{19} \mathrm{cm}^{-3}$ and wherein said cap layer has a plasma wavelength $\lambda_p$ greater than $2\lambda_g$, where $\lambda_g$ is the characteristic wavelength of said emitter layer and said base layer.

2. The thermophotovoltaic energy conversion device according to claim 1, further including an interference filter, positioned between a heat source and said n-type cap layer, for reflecting photons having a wavelength greater than a wavelength corresponding to a bandgap of said emitter layer and said base layer and less than the plasma wavelength of said cap layer.

3. The thermophotovoltaic energy conversion device according to claim 1, further including a passivation layer located between said n-type emitter layer and said n-type cap layer, and a passivation layer located between said p-type base layer and said p-type substrate.

4. The thermovoltaic energy conversion device according to claim 1, wherein said emitter layer, said base layer and said cap layer are selected from: InGaAs, InPAs, InGaSb, GaSb, InAs, InGaAsSb, and InAsPSb.

5. The thermophotovoltaic energy conversion device according to claim 4, wherein said emitter layer, said base layer and said cap layer are selected from: InGaAs or InPAs.

6. The thermophotovoltaic energy conversion device according to claim 4, wherein said substrate is selected from GaSb, InP, GaAs, InAs, InGaAs, silicon and InGaAsSb.

7. A thermophotovoltaic energy conversion device comprising:

a p-type emitter layer having first and second opposed sides;

an n-type base layer in contact with the first side of said emitter layer;

a highly doped n-type cap layer formed on the second side of said emitter layer, said cap layer having a doping level N, wherein $N \geq 5 \times 10^{19} \mathrm{~cm}^{-3}$ and having a plasma wavelength $\lambda_p$ greater than $2\lambda_g$, where $\lambda_g$ is a characteristic wavelength of said emitter layer and said base layer;

and an n-type substrate.

8. The thermophotovoltaic energy conversion device according to claim 7, further including an interference filter, positioned between a heat source and said n-type cap layer, for reflecting photons having a wavelength greater than a wavelength corresponding to a bandgap of said emitter and base layers and less than a plasma wavelength of said cap layer.

9. The thermophotovoltaic energy conversion device according to claim 7, further including a passivation layer located between said p-type emitter layer and said n-type cap layer, and a passivation layer located between said n-type base layer and said n-type substrate.

10. The thermophotovoltaic energy conversion device according to claim 7, wherein said emitter layer, said base layer, and said cap layer are selected from: InGaAs, InPAs, InGaSb, GaSb, InAs, InGaAsSb, and InAsPSb.

11. The thermophotovoltaic energy conversion device according to claim 10, wherein said emitter layer, said base layer and said cap layer are selected from: InGaAs or InPas.

12. The thermophotovoltaic energy conversion device according to claim 10, wherein said substrate is selected from GaSb, InP, GaAs, InAs, InGaAs, silicon and InGaAsSb.

13. A thermophotovoltaic energy conversion device comprising:

a p-type base layer; and a highly doped n-type emitter layer attached to said base layer, said emitter layer having a doping level N, wherein $N \geq 5 \times 10^{19}$ cm$^{-3}$, and said emitter layer having a plasma wavelength $\lambda_p$ greater than $2\lambda_g$, where $\lambda_g$ is the characteristic wavelength of said base layer; and a p-type substrate.

14. The thermophotovoltaic energy conversion device according to claim 13, further including an interference filter, positioned between a heat source and said n-type emitter layer, for reflecting photons having a wavelength greater than a wavelength corresponding to a bandgap of said emitter layer and base layer and less than a plasma wavelength of the emitter layer.

15. The thermophotovoltaic energy conversion device according to claim 13, further including a passivation layer between said p-type base layer and said p-type substrate.

16. The thermophotovoltaic energy conversion device according to claim 13, wherein said emitter layer and said base layer are selected from: InGaAs, InPAs, InGaSb, GaSb, InAs, InGaAsSb, and InAsPSb.

17. The thermophotovoltaic energy conversion device according to claim 16, wherein said emitter layer and said base layer are selected from InGaAs and InPAs.

18. The thermophotovoltaic energy conversion device according to claim 16, wherein said substrate is selected from GaSb, InP, GaAs, InAs, InGaAs, silicon and InGaAsSb.

* * * * *